United States Patent
Wright et al.

(10) Patent No.: US 6,774,998 B1
(45) Date of Patent: Aug. 10, 2004

(54) METHOD AND APPARATUS FOR IDENTIFYING MISREGISTRATION IN A COMPLIMENTARY PHASE SHIFT MASK PROCESS

(75) Inventors: Marilyn I. Wright, Austin, TX (US); Kevin R. Lensing, Austin, TX (US); James Broc Stirton, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 265 days.

(21) Appl. No.: 10/034,790

(22) Filed: Dec. 27, 2001

(51) Int. Cl.[7] .............................................. G01B 11/00
(52) U.S. Cl. ..................... 356/401; 356/399; 356/400; 438/7
(58) Field of Search ................................ 356/603, 394, 356/392, 399, 401, 400, 604, 606–610, 237.4–237.5; 430/5, 30; 438/5–7

(56) References Cited

U.S. PATENT DOCUMENTS

| | | | |
|---|---|---|---|
| 6,051,348 A | 4/2000 | Marinaro et al. | ............. 430/30 |
| 6,245,584 B1 | 6/2001 | Marinaro et al. | ............. 438/14 |
| 6,433,878 B1 * | 8/2002 | Niu et al. | ................... 356/603 |
| 6,458,605 B1 * | 10/2002 | Stirton | ........................... 438/7 |
| 6,603,529 B1 * | 8/2003 | Finarov | ....................... 355/27 |
| 6,710,876 B1 * | 3/2004 | Nikoonahad et al. | ........ 356/401 |

\* cited by examiner

*Primary Examiner*—Frank G. Font
*Assistant Examiner*—Layla Lauchman
(74) *Attorney, Agent, or Firm*—Williams, Morgan & Amerson

(57) ABSTRACT

A method includes providing a wafer having a first grating structure and a second grating structure formed in a photoresist layer. At least a portion of the first and second grating structures is illuminated with a light source. Light reflected from the illuminated portion of the first and second grating structures is measured to generate a reflection profile. Misregistration between the first and second grating structures is determined based on the reflection profile. A processing line includes a photolithography stepper, a metrology tool, and a controller. The photolithography stepper is adapted to process wafers in accordance with an operating recipe. The metrology tool is adapted to receive a wafer processed in the stepper. The wafer has a first grating structure and a second grating structure formed in a photoresist layer. The metrology tool includes a light source, a detector, and a data processing unit.

61 Claims, 8 Drawing Sheets

METHOD AND APPARATUS FOR IDENTIFYING MISREGISTRATION IN A COMPLIMENTARY PHASE SHIFT MASK PROCESS

BACKGROUND OF THE INVENTION

1. Field of the Invention

This invention relates generally to the field of semiconductor device manufacturing and, more particularly, to a method and apparatus for identifying misregistration in a complimentary phase shift mask process.

2. Description of the Related Art

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing the defects in the manufacture of the components of a typical transistor also lowers the overall cost per transistor as well as the cost of integrated circuit devices incorporating such transistors.

The technologies underlying semiconductor processing tools have attracted increased attention over the last several years, resulting in substantial refinements. However, despite the advances made in this area, many of the processing tools that are currently commercially available suffer certain deficiencies. In particular, such tools often lack advanced process data monitoring capabilities, such as the ability to provide historical parametric data in a user-friendly format, as well as event logging, real-time graphical display of both current processing parameters and the processing parameters of the entire run, and remote, i.e., local site and worldwide, monitoring. These deficiencies can engender nonoptimal control of critical processing parameters, such as throughput, accuracy, stability and repeatability, processing temperatures, mechanical tool parameters, and the like. This variability manifests itself as within-run disparities, run-to-run disparities and tool-to-tool disparities that can propagate into deviations in product quality and performance, whereas an ideal monitoring and diagnostics system for such tools would provide a means of monitoring this variability, as well as providing means for optimizing control of critical parameters.

Semiconductor devices are manufactured from wafers of a semiconducting material. Layers of materials are added, removed, and/or treated during fabrication to create the electrical circuits that make up the device. The fabrication essentially comprises four basic operations. Although there are only four basic operations, they can be combined in hundreds of different ways, depending upon the particular fabrication process.

The four operations typically used in the manufacture of semiconductor devices are:

layering, or adding thin layers of various materials to a wafer from which a semiconductor device is produced;

patterning, or removing selected portions of added layers;

doping, or placing specific amounts of dopants in the wafer surface through openings in the added layers; and heat treatment, or heating and cooling the materials to produce desired effects in the processed wafer.

Proper formation of sub-sections within a semiconductor device is an important factor in ensuring proper performance of the manufactured semiconductor device. Critical dimensions of the sub-sections generally have to be within a predetermined acceptable margin of error for semiconductor devices to be within acceptable manufacturing quality.

Features are formed in semiconductor devices by patterning various layer of material formed on the wafer. This patterning is generally conducted by forming a photoresist layer over a process layer that is to be patterned. The photoresist layer is then exposed through a photomask to create a pattern in the photoresist layer. Exposed or unexposed portions of the photoresist layer are removed (i.e., depending on the type of photoresist material used) leaving underlying portions of the process layer exposed. The exposed process layer is then removed by performing an etching process while using the patterned layer of photoresist as a mask to thereby duplicate a pattern in the photoresist mask in the process layer.

There are various types of photomasks that may be used for patterning the photoresist layer. A binary mask typically includes a transparent substrate (e.g., quartz) on which a pattern is formed using an opaque material (e.g., chromium). The opaque portions prevent exposure of the underlying photoresist layer thereby transferring the pattern formed in the opaque layer to the photoresist layer. Due to limitations imposed by the wavelength of light used to transfer the pattern, resolution at the edges of the patterns of the photomask degrades, thus limiting the application of the binary mask as the geometry of the features to be formed on the wafer decreases.

Another type of photomask capable of forming smaller features than a typical binary mask is a phase shift mask. Phase shift masks typically allow for the formation of much smaller features than their binary counterparts. FIGS. 1A and 1B illustrate top and cross section views an exemplary phase-shift mask 10, respectively. A trench 20 is formed in a transparent substrate 30. The difference in thicknesses of the substrate layer 20 in and out of the trench causes a phase shift in the light passing through the mask. At the edges of the trench 20 (i.e., phase edges 40), the light undergoes a 180 degree phase transition. Interference between the opposite phase light waves results in the formation of a null region beneath the phase edge 40. Hence, an underlying photoresist layer is not exposed where the null regions form.

The phase shift mask 10 creates null regions wherever there is a 180 degree transition. In some instances, these nulls may form in regions where it is not desirable to form a feature in the underlying photoresist layer. For examples, null regions may form beneath the edges 50. The patterns of unexposed photoresist formed by these undesired null regions are referred to herein as artifacts. A second masking operation is performed after the phase shift masking operation to expose the photoresist layer in these regions where it is not desired to form features. The second masking operation is typically performed using a binary mask which prevents exposure of the photoresist layer where features are desired and allows exposure of the photoresist layer in the other regions, thus "erasing" the artifacts. This two step masking process is commonly referred to as a complimentary phase shift mask (CPSM) process.

The binary mask may also be used to form other features where the dimensional requirements are not as stringent as those for the features formed using the phase shift mask. Typically, a semiconductor device may include an array of densely-packed transistors. The phase shift mask may be used to pattern the gate electrode lines for these features to allow for a greater density. The device may also employ transistors in other regions of the device where a high feature density is not required. The gate electrode lines for these transistors may be formed using the binary mask.

An important aspect of a CPSM patterning process is overlay control. Overlay control involves measuring the misalignment, or misregistration, between the pattern formed by the phase shift mask and the pattern formed by the binary mask. If a misalignment occurs between the two masks, the binary mask may not erase all of the artifacts formed by the phase shift mask patterning process. As technology facilitates smaller critical dimensions for semiconductor devices, the need for the reduction of misalignment errors increases dramatically.

Generally, a set of photolithography steps is performed on a lot of wafers using a semiconductor manufacturing tool commonly referred to as an exposure tool or a stepper. The manufacturing tool communicates with a manufacturing framework or a network of processing modules. The manufacturing tool is generally connected to an equipment interface. The equipment interface is connected to a machine interface to which the stepper is connected, thereby facilitating communications between the stepper and the manufacturing framework. The machine interface may generally be part of an advanced process control (APC) system. The APC system initiates a control script, which can be a software program that automatically retrieves the data needed to execute a manufacturing process. The input parameters that control the manufacturing process may be revised periodically in a manual fashion. As the need for higher precision manufacturing processes increases, improved methods are needed to revise input parameters that control manufacturing processes in a more automated and timely manner.

The present invention is directed to overcoming, or at least reducing the effects of, one or more of the problems set forth above.

SUMMARY OF THE INVENTION

A method in accordance with one aspect of the present invention includes providing a wafer having a first grating structure and a second grating structure formed in a photoresist layer. At least a portion of the first and second grating structures is illuminated with a light source. Light reflected from the illuminated portion of the first and second grating structures is measured to generate a reflection profile. Misregistration between the first and second grating structures is determined based on the reflection profile.

A processing line in accordance with another aspect of the present invention includes a photolithography stepper, a metrology tool, and a controller. The photolithography stepper is adapted to process wafers in accordance with an operating recipe. The metrology tool is adapted to receive a wafer processed in the stepper. The wafer has a first grating structure and a second grating structure formed in a photoresist layer. The metrology tool includes a light source, a detector, and a data processing unit. The light source is adapted to illuminate at least a portion of the first and second grating structures. The detector is adapted to measure light reflected from the illuminated portion of the first and second grating structures to generate a reflection profile. The data processing unit is adapted to determine misregistration between the first and second grating structures based on the reflection profile. The controller is adapted to determine at least one parameter of the operating recipe of the photolithography stepper based on the determined misregistration

BRIEF DESCRIPTION OF THE DRAWINGS

The invention may be understood by reference to the following description taken in conjunction with the accompanying drawings, in which like reference numerals identify like elements, and in which.

Figure 1B:
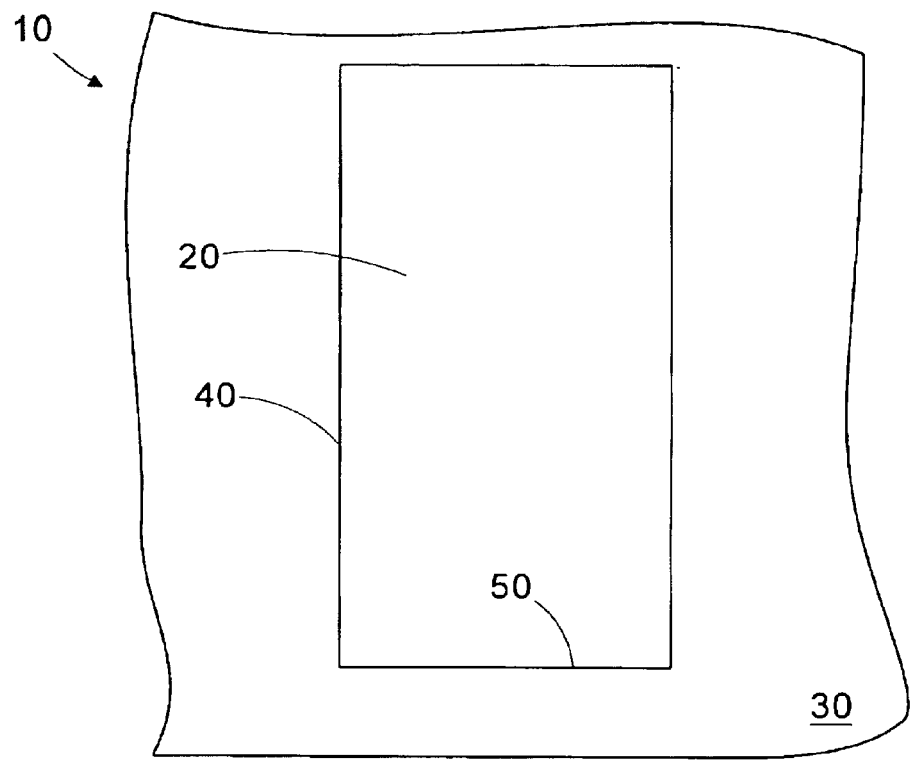
FIGS. 1A and 1B are top and cross section views of an exemplary prior art phase shift photomask.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 2:
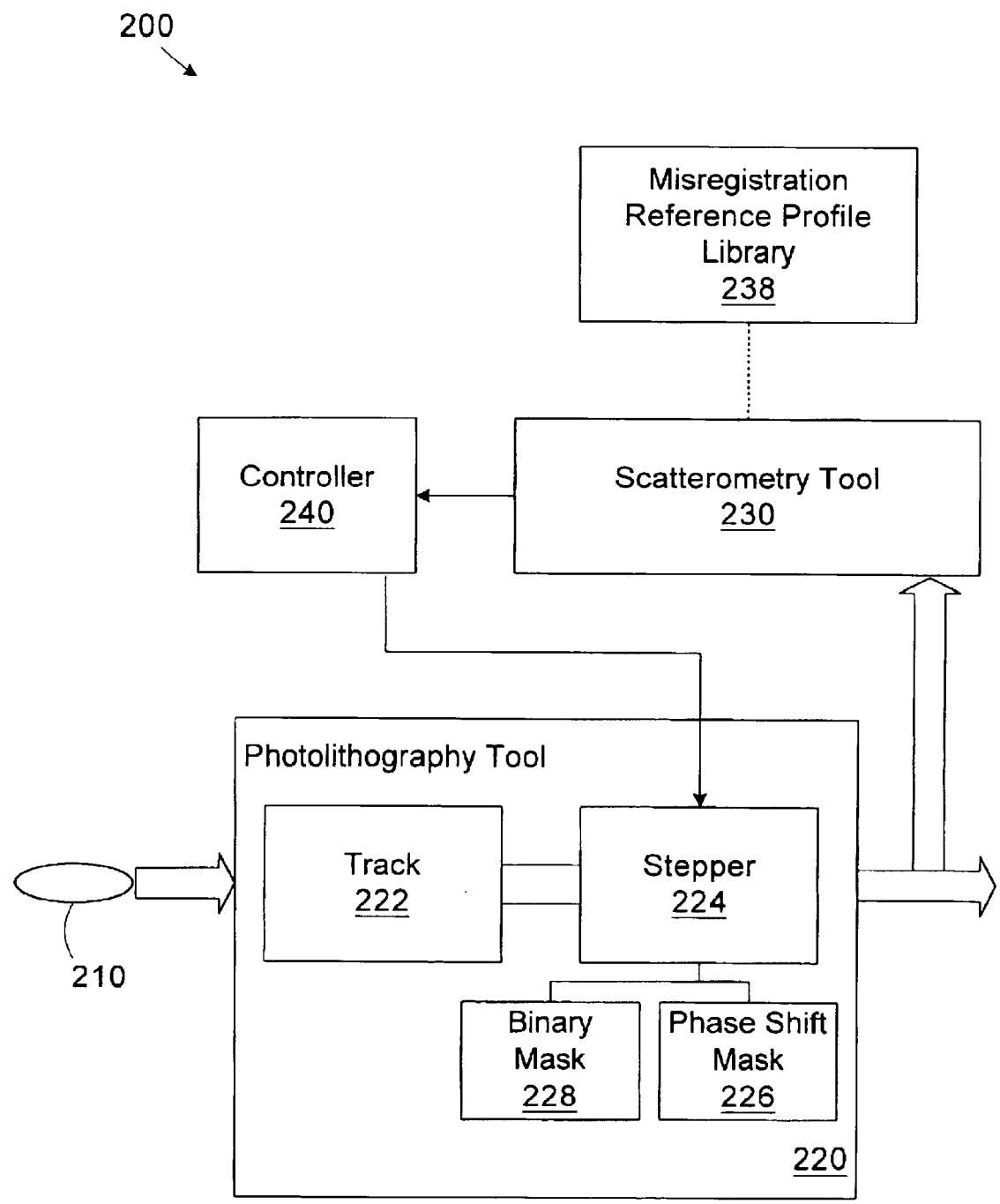
FIG. 2 is a simplified diagram of an illustrative processing line for performing a complimentary phase shift masking process in accordance with one illustrative embodiment of the present invention.

Referring to FIG. 2, a simplified diagram of an illustrative processing line 200 for processing wafers 210 in accordance with one illustrative embodiment of the present invention is provided. The processing line 200 includes a photolithography tool 220 for forming a pattern in a photoresist layer formed on the wafer 210. In one illustrative embodiment, the photolithography tool 220 includes a track 222 coupled to a stepper 224. The track 222 spins photoresist material onto the wafer 210 and pre-bakes the photoresist layer. The stepper 224 exposes the photoresist layer to form a pattern in the photoresist layer. In the illustrated embodiment the processing line is adapted to perform a complimentary phase shift mask patterning operation in two steps using a phase shift mask 226 and a binary mask 228. Although only one photolithography tool 220 is shown, the processing line 200 may include multiple photolithography tools 220, one using the phase shift mask 226 and another using the binary mask 228.

After the stepper 224 exposes the wafer 210, the track 222 may perform a post-exposure bake (i.e., if necessary for the type of photoresist layer used) and apply a developer solution to remove the exposed portions of the photoresist layer (i.e., for a positive-type photoresist material) to generate a pattern in the photoresist layer. The photoresist layer is typically used as a mask for a subsequent etch process used to form features on the wafer 210 or as a mask for performing an implantation process (e.g., for doping a substrate to form active regions.

The processing line 200 also includes a scatterometry tool 230 adapted to identify misregistration between the pattern formed by the phase shift mask 226 and the pattern formed by the binary mask 228. In general, the scatterometry tool 230 includes optical hardware, such as an ellipsometer or reflectometer, and a data processing unit loaded with a scatterometry software application for processing data collected by the optical hardware. For example, the optical hardware may include a model OP5140 or OP5240 with a spectroscopic ellipsometer offered by Therma-Wave, Inc. of Freemont Calif. The data processing unit may in comprise a profile application server manufactured by Timbre Technologies, a subsidiary of Tokyo Electron Limited, Inc. of Tokyo, Japan and distributed by Therma-Wave, Inc. The scatterometry tool 230 may be external or, alternatively, the scatterometry tool 230 may be installed in an in-situ arrangement.

A controller 240 is provided for providing feedback to the photolithography tool 220 based on the misregistration measurements generated by the scatterometry tool 230. The controller 240 adjusts the operating recipe of the stepper 224 to correct for misregistration errors. In the illustrated embodiment, the controller 240 is a computer programmed with software to implement the functions described. However, as will be appreciated by those of ordinary skill in the art, a hardware controller designed to implement the particular functions may also be used. Moreover, the functions performed by the controller 240, as described herein, may be performed by multiple controller devices distributed throughout a system. Additionally, the controller 240 may be a stand-alone controller, it may be integrated into a tool, such as the photolithography tool 220, or the scatterometry tool 230, or it may be part of a system controlling operations in an integrated circuit manufacturing facility.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the controller 240, as described, is the Catalyst system offered by KLA-Tencor, Inc. The Catalyst system uses Semiconductor Equipment and Materials International (SEMI) Computer Integrated Manufacturing (CIM) Framework compliant system technologies and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

Wafers 210 are processed in the stepper 224 using a plurality of control input signals. In the illustrated embodiment, the control inputs signals used to configure the stepper 224 include an x-translation signal, a y-translation signal, an x-expansion wafer scale signal, a y-expansion wafer scale signal, a reticle magnification signal, a reticle rotation signal, a wafer rotation signal, and a wafer non-orthogonality signal. The controller 240 is adapted to update the control input signals based on misregistration measurements performed by the scatterometry tool 230.

When the stepper 224 completes processing of a wafer 210, the wafer 210 is examined by the scatterometry tool 240. The wafer may be examined prior to developing of the photoresist layer (i.e., using the latent photoresist image) or after the developing process (i.e., using the photoresist pattern). The scatterometry tool 240 provides a measurement of misregistration that was present in the previous exposure steps (i.e., phase shift and binary). The amount of misregistration relates to the misalignment in the photolithography process that occurred between the two masking operations.

Figure 1A:
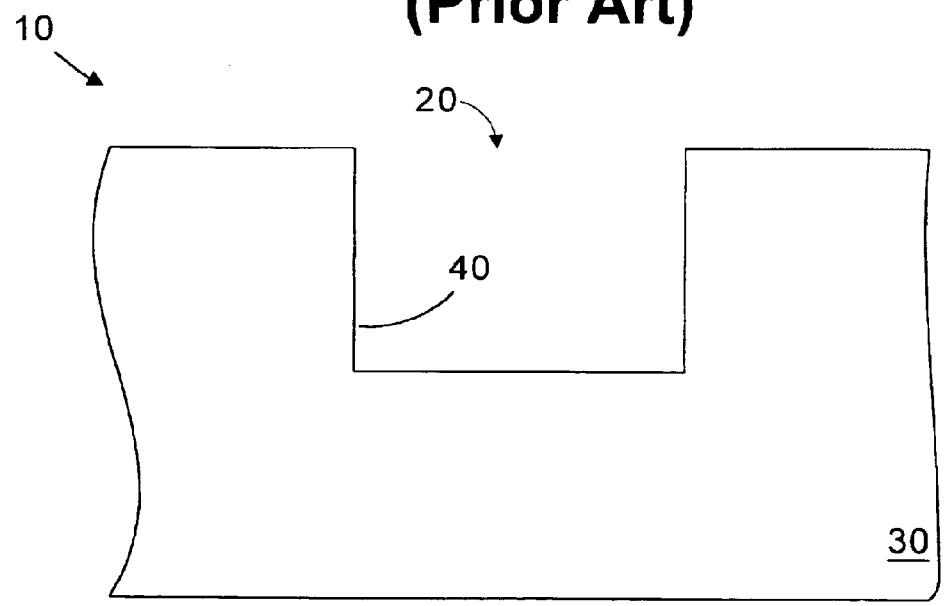

Turning now to FIGS. 3A–3D, cross section views of an exemplary test structure 300 that may be used to measure misregistration in the processing line of FIG. 1 are shown. The test structure 300 of FIGS. 3A–3D may be formed in a region of the wafer 210 not normally used for forming devices (e.g., in the periphery region where identification codes are typically scribed or in the scribe lines between production die). The wafer 210 may include multiple test structures 300 having differing orientations for measuring the misregistration in different directions (e.g., X and Y).

Figure 3A:
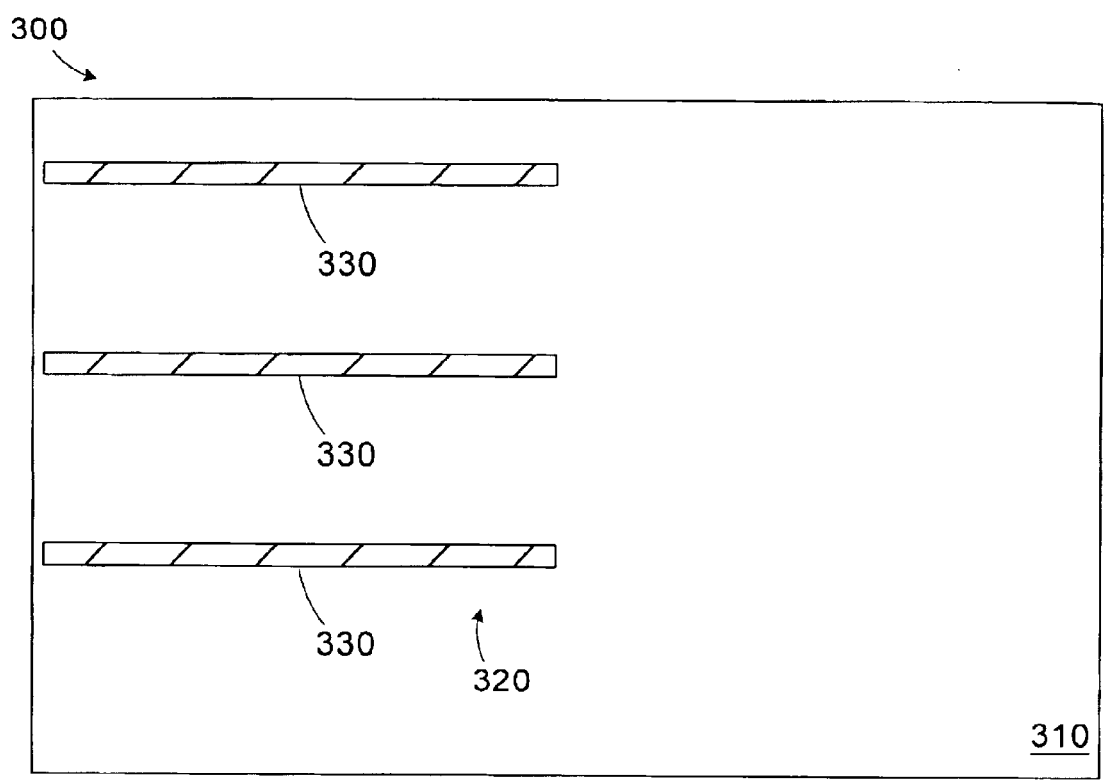
FIGS. 3A, 3B, 3C, 3D, and 3E are cross section views of exemplary structures that may be used to measure misregistration in the processing line of FIG. 2.

FIG. 3A is a top view of the test structure 300 including a photoresist layer 310. During the exposure process using the phase shift mask 226, a first grating structure 320 including a first plurality of lines 330 is defined in a photoresist layer 310. The phase shift mask 226 includes phase edges designed to generate null regions in the photoresist layer 310 where the lines 330 are to be patterned. The width of lines 330 may vary depending on the particular stepper 224 used and the product being manufactured. In one embodiment, the width of the lines 330 may be between about 80 and 170 nm.

Figure 3B:
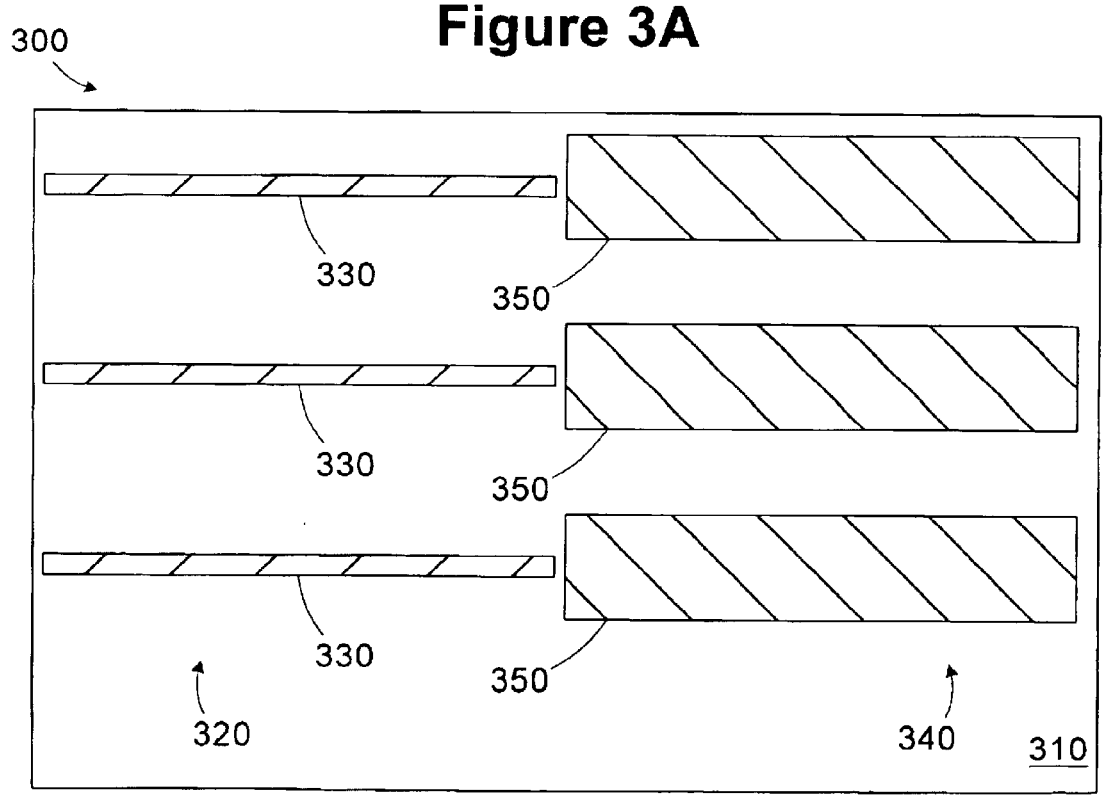

As shown in FIG. 3B, a second grating structure 340 including a second plurality of lines 350 is patterned in the photoresist layer 310 during the exposure performed using the binary mask 228. The binary mask 228 includes optically opaque lines corresponding to the lines 350. Again, the width of lines 350 may vary depending on the particular stepper 224 used and the product being manufactured. In one embodiment, the width of the lines 350 may be between greater than 150 nm.

Figure 3C:
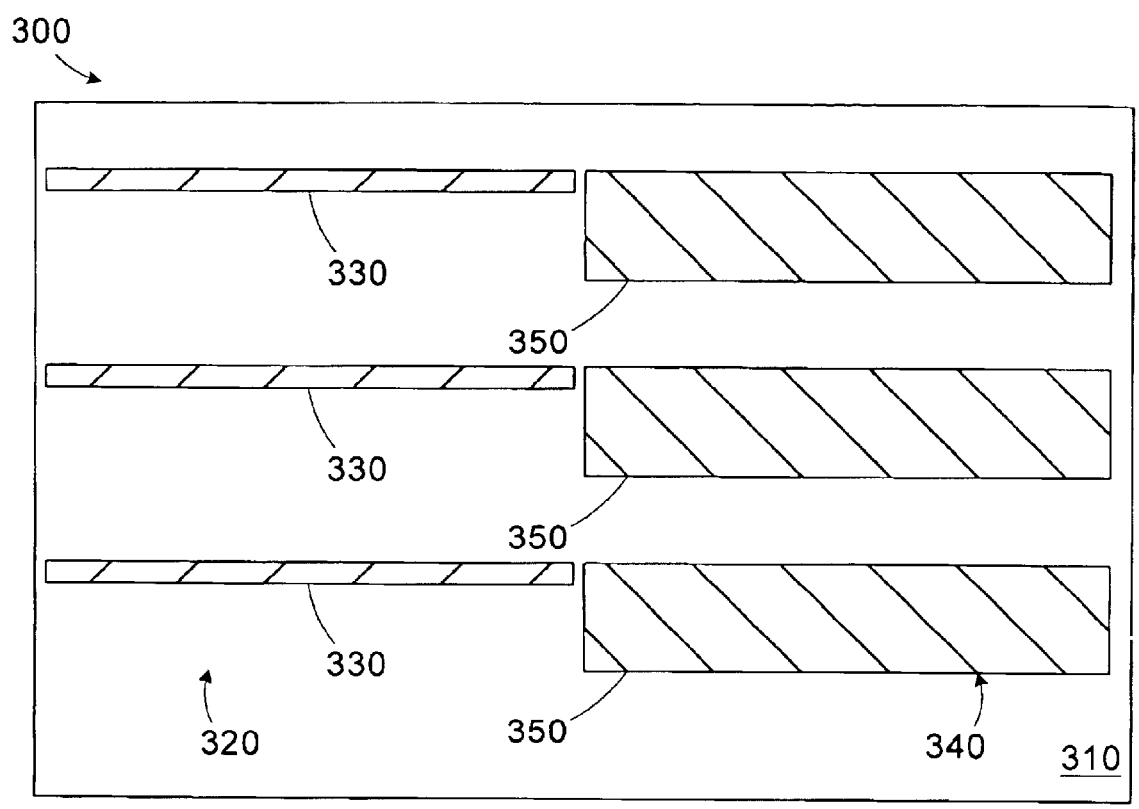
Figure 3D:
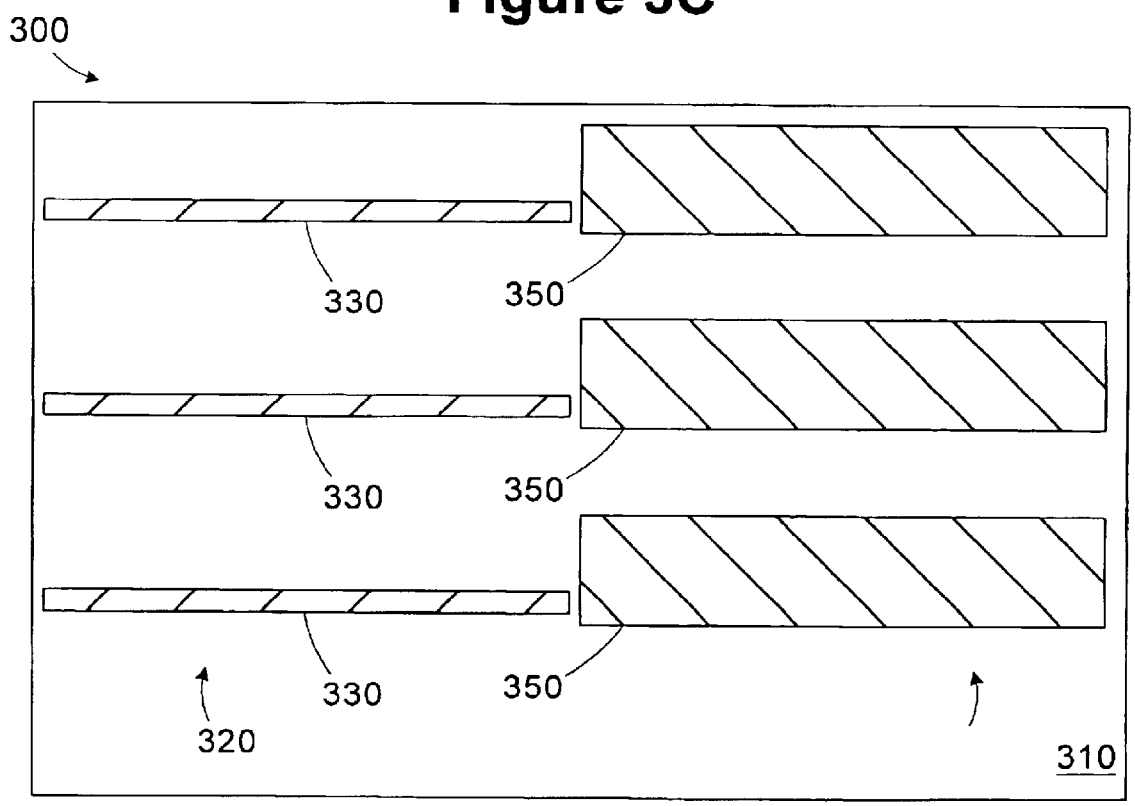

In the test structure 300 of FIG. 3B, the first and second grating structures 320, 340 are aligned as designed (i.e., the lines 330 are centered with respect to the lines 350). FIGS. 3C and 3D illustrate situations where misregistration exists between the first and second grating structures 320, 340. Note the lines 330, 350 are no longer centered with respect to each other.

Figure 3E:
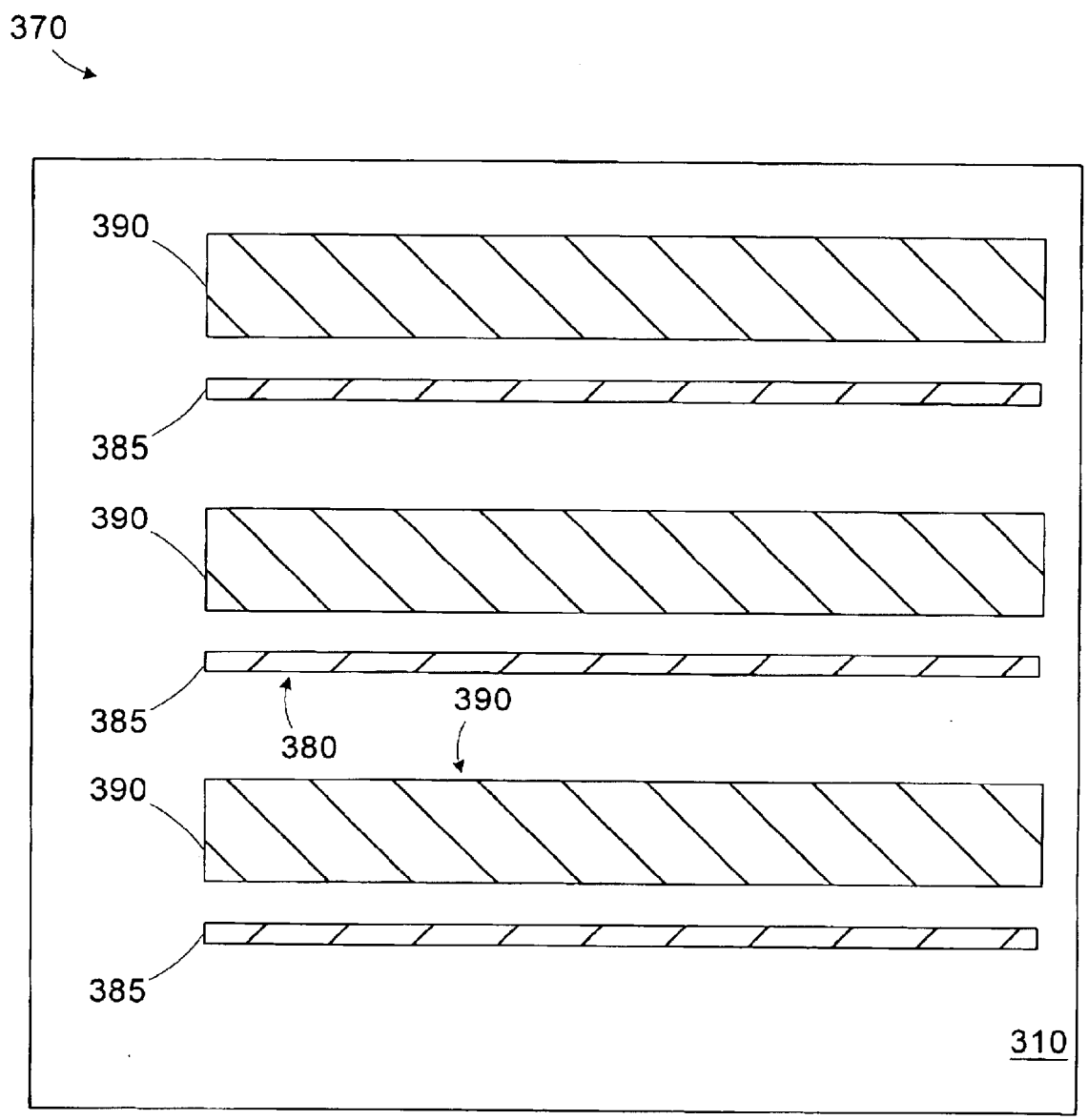

FIG. 3E illustrates an alternative embodiment of a test structure 370 including first and second grating structures 380, 390 formed in a similar manner to the grating structures 320, 340 formed in FIG. 3B. However, lines 385 of the first grating structure 380 are interleaved with lines 395 of the second grating structure 390. The arrangement of the grating structures 380, 390 in FIG. 3E may be used to measure misregistration in the Y direction. The lines 385, 395 may be formed vertically to measure misregistration in the X direction.

Using the test structure 300 or 320, the scatterometry tool 230 is adapted to measure the misregistration between the first and second grating structures 320, 340 or 380, 390, and the controller 240 is adapted to control the photolithography tool 220 for subsequently patterned photoresist layers 250 to correct the misregistration.

Figure 4:
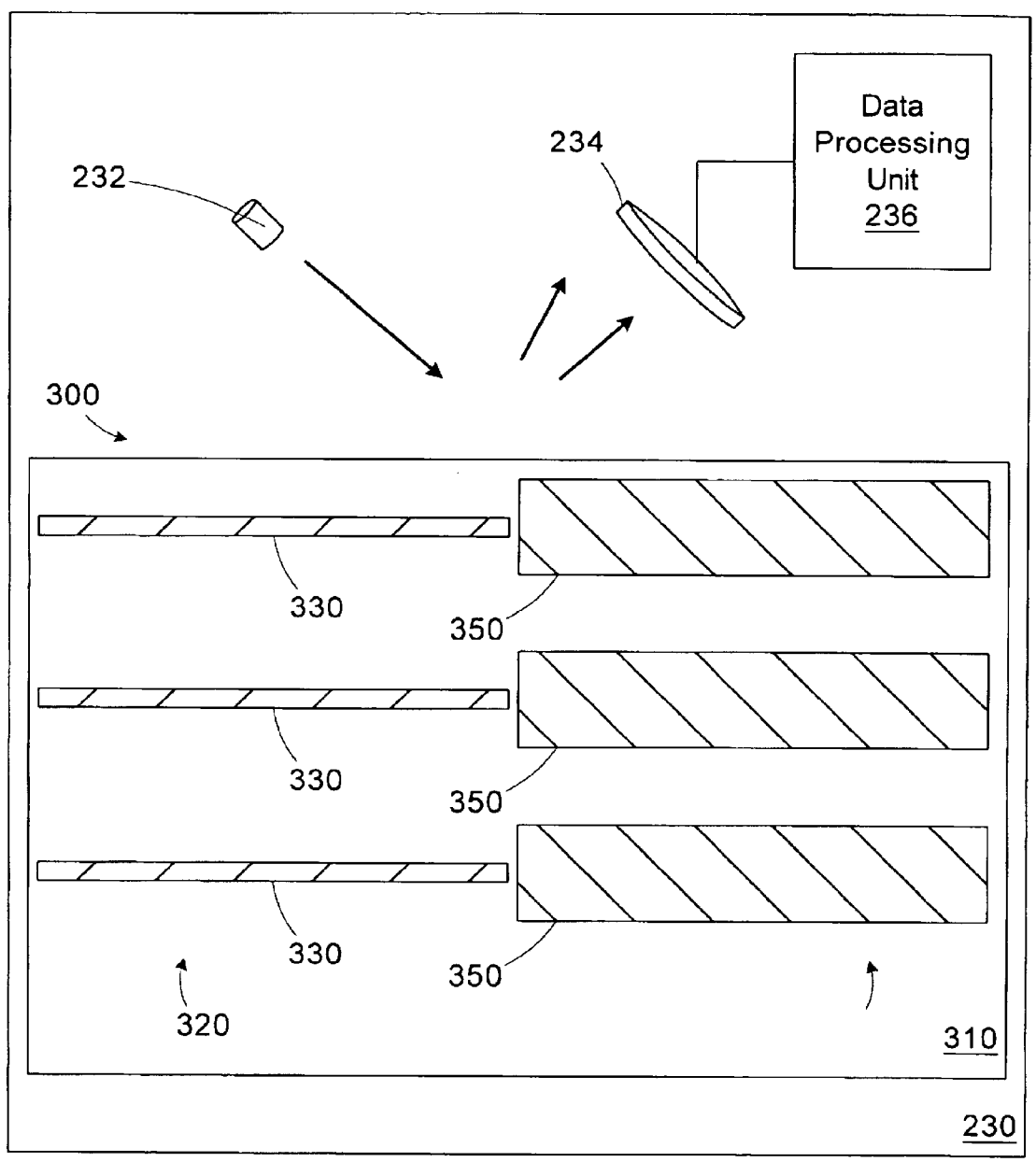
FIG. 4 is a simplified view of the scatterometry tool of FIG. 2.

Turning now to FIG. 4, the operation of the scatterometry tool 230 is described as it may be used to measure misregistration using the structure 300 of FIGS. 3A–3D. Other test structures, such as the test structure 370 of FIG. 3E may be used. The scatterometry tool 230, includes a light source 232 and a detector 234 positioned proximate the test structure 300. The light source 232 of the scatterometry tool 230 illuminates at least a portion of the test structure 300, and the detector 234 takes optical measurements, such as intensity or phase, of the reflected light. A data processing unit 236 receives the optical measurements from the detector 234 and processes the data to characterize the misregistration existing between the first and second grating structures 320, 340.

The scatterometry tool 230 may use monochromatic light, white light, or some other wavelength or combinations of wavelengths, depending on the specific implementation. The angle of incidence of the light may also vary, depending on the specific implementation. The light analyzed by the scatterometry tool 230 typically includes a reflected component (i.e., incident angle equals reflected angle) and a refracted component (i.e., incident angle does not equal the reflected angle). For purposes of discussion here, the term "reflected" light is meant to encompass both components. Dimensional variations cause changes in the reflection profile (e.g, intensity vs. wavelength—$\tan(\delta)$, phase vs. wavelength—$\cos(\psi)$, where $\delta$ and $\psi$ are common scatterometry outputs known to those of ordinary skill in the art) measured by the scatterometry tool 230.

Figure 5A:
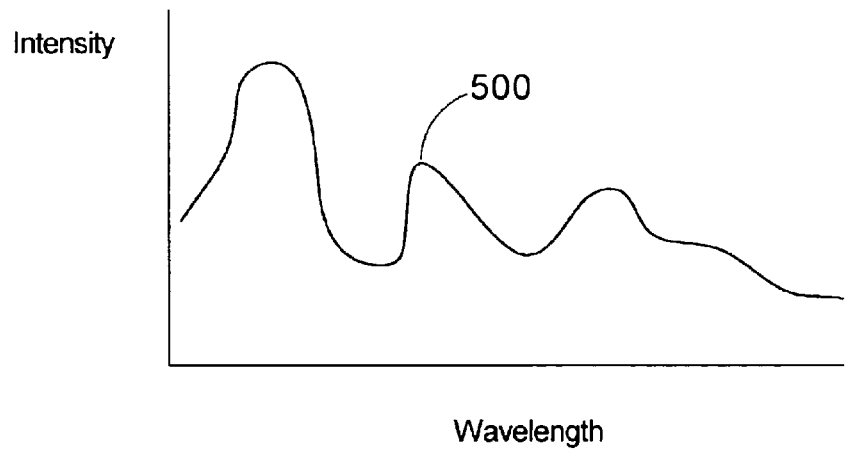
FIGS. 5A, 5B, and 5C illustrate a library of exemplary scatterometry curves used to characterize misregistration in the wafer measured in the scatterometry tool of FIG. 4.
Figure 5B:
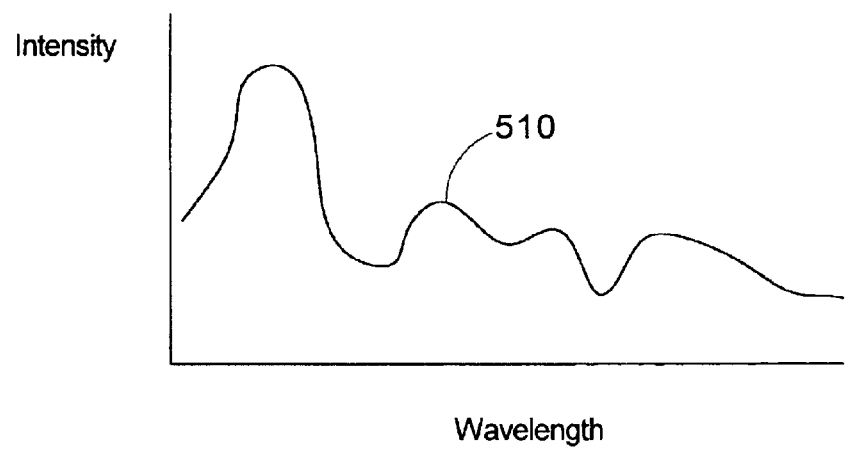
Figure 5C:
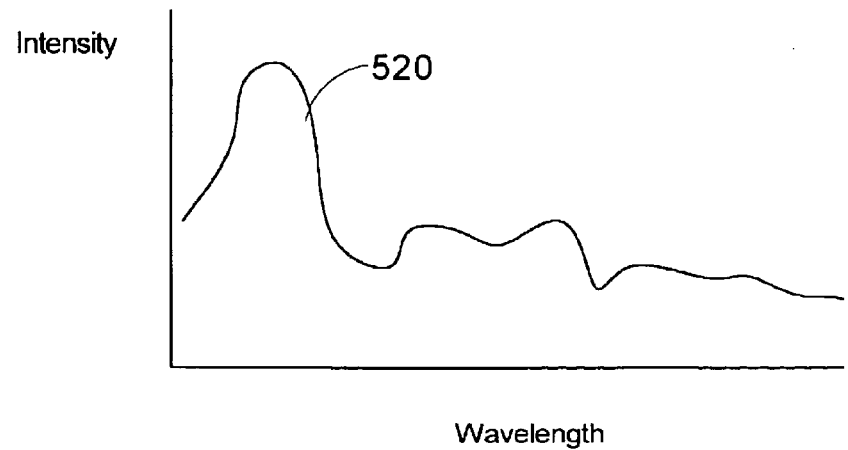

FIGS. 5A, 5B, and 5C illustrate exemplary reflection profiles 500, 510, 520 that may be included in a misregistration reference profile library 238 (see FIG. 1) used by the data processing unit 236 to characterize the misregistration existing between the first and second grating structures 320, 340 based on the reflection profiles measured by the scatterometry tool 230. The particular reflection profile expected for any structure depends on the specific geometry of the grating structures 320, 340 and the parameters of the measurement technique employed by the scatterometry tool 230 (e.g., light bandwidth, angle of incidence, etc.). The profiles in the misregistration reference profile library 238 are typically calculated theoretically by employing Maxwell's equations to model individual spectra based on the expected characteristics of the grating structures 320, 340 with differing degrees of misregistration. Spectra are generated at a pre-determined resolution for many, if not all, levels of misregistration that may be expected, and the sum of all said spectra constitute the misregistration reference profile library 238. Scatterometry libraries are commercially available from Timbre Technologies, Inc. The profiles in the misregistration reference profile library 238 may also be generated empirically by measuring reflection profiles of sample wafers and subsequently characterizing the measured wafers by destructive or non-destructive examination techniques.

The reflection profiles 500, 510, 520 of FIGS. 5A, 5B, and 5C represent exemplary reflection profiles for the misregistration reference profile library 238 with varying degrees of misregistration. The reflection profiles of test structures 300 with different amounts of misregistration may be included in the misregistration reference profile library 238.

The data processing unit 236 receives a reflection profile measured by the detector 234 and compares it to the misregistration reference profile library 238. Each reference profile has an associated misregistration metric related to the misregistration existing between the first and second grating structures 320, 340. For example, the misregistration metric may comprise misregistration measurements expressed in microns. The data processing unit 236 determines the reference reflection profile having the closest match to the measured reflection profile. Techniques for matching the measured reflection profile to the closest reference reflection profile are well known to those of ordinary skill in the art. For example, a least squares error technique may be employed.

In another embodiment, the controller 240 or other external controller (not shown) may be adapted to compare the measured reflection profile to the misregistration reference profile library 238. In such a case, the scatterometry tool 230 outputs the matching reference reflection profile, and the controller 240 links that reference reflection profile to an associated misregistration metric.

In yet another embodiment, the measured reflection profile may be compared to a target reflection profile selected from the misregistration reference profile library 238 having a known and acceptable degree of misregistration. For example, the data processing unit 236 may generate a target reflection profile for the structure 300 shown in FIG. 3B having no, or at least acceptable amounts of misregistration using Maxwell's equations. The measured reflection profile generated by the scatterometry tool 230 may then be compared to the target reflection profile. Based upon this comparison, a relatively rough approximation of the misregistration may be determined. That is, by comparing the measured reflection profile to the target reflection profile, the degree of misregistration may be approximated, such that further matching of the measured reflection profile with additional reference reflection profiles is unwarranted. Using this technique, an initial determination may be made as to the misregistration. Of course, this step may be performed in addition to the matching or correlating of a measured reflection profile to a reference reflection profile from the misregistration reference profile library 238 as described above.

After receiving the degree of misregistration from the scatterometry tool 230, the controller 240 may take a variety of autonomous actions. These actions may include fault detection and/or process control functions. In one embodiment of the present invention, the controller 240 is adapted to modify the operating recipe of the photolithography tool 220 based on the misregistration metric to control operations on subsequently processed wafers. The controller 240 may also use the misregistration metric for fault detection. If the measured amount of misregistration is above a predetermined threshold, the wafer may be reworked (i.e., the photoresist layer is stripped and reformed) prior to performing any additional process steps.

The controller 240 may adjust the recipes for subsequently processed wafers to control the overlay control inputs of the stepper 224. The controller 240 may be configured with a deadband range, in which no corrections are made. The misregistration determined from the misregistration metric is compared to a predetermined set of threshold parameters. In one embodiment, the deadband contains a range of error values associated with control input signals centered proximate a set of corresponding predetermined target values. If the misregistration error acquired from the scatterometry tool 230 is smaller than its corresponding predetermined threshold value, that particular error is deemed to be in the deadband, and the controller 240 makes no changes to the overlay control inputs. A primary purpose of the deadband is to prevent excessive control actions from causing the semiconductor manufacturing process to be inordinately jittery.

When the controller 240 determines that a misregistration error corresponding to an overlay control input signal is not inside the deadband, the misregistration error is used to update that overlay control input signal for a photolithography process performed on a subsequent wafer (or the current wafer if it is reworked). The controller 240 determines a step size for changing in the value of the overlay control input signal in accordance with a control model. Equation 1 below provides an exemplary control equation for determining a change to an overlay control input signal.

New setting=Old setting−[(weight)*(misregistration value)]  (1)

As illustrated in Equation 1, the controller 240 determines the new setting of the overlay control input signal by subtracting the magnitude of the old setting of the overlay control input signal from the product of the weight and the misregistration value. The weight is a predetermined gain parameter that is assigned to the error value of a particular overlay control input signal. The particular value for the weight may be determined by control simulation or experimentation.

Although the weight value can be used to partially control the step size of the change in the setting of the overlay control input signal, the value of the weight may still be insufficient to prevent an excessively large step size. In other words, even if an optimum weight were to be assigned to a particular error signal, a calculated step size of a change in the setting of a control input signal may be too large, such that it could cause a controller of a semiconductor manufacturing tool to perform in an excessively jittery fashion. Accordingly, the controller 240 may compare the calculated step size to a predetermined maximum step size that is allowable for the change in setting of the overlay control input signal, and thus limit the step size.

One method for using the updated overlay control input signals is implemented using control threads. Control threads can be implemented by the controller 240. Control threads are a significant part of the control scheme of a semiconductor manufacturing tool, such as the stepper 224. Each control thread acts like a separate controller, and is differentiated by various process conditions. For overlay control, the control threads are separated by a combination of different conditions, including the semiconductor manufacturing tool (e.g., stepper 224) currently processing the wafer lot, the semiconductor product, the semiconductor manufacturing operation, and the semiconductor manufacturing tool that processed the semiconductor wafer lot at a previous layer of the wafer.

Control threads account for different semiconductor manufacturing process conditions affect the misregistration in different fashions. By isolating each of the unique semiconductor manufacturing process conditions into its own corresponding control thread, the controller may more accurately evaluate the conditions in which a subsequent semiconductor wafer lot in the control thread will be processed. Since the error measurement is more relevant, changes to the overlay control input signals based upon the error will be more appropriate. The implementation of the control scheme described by the present invention can lead to a reduction in the misregistration.

The effectiveness of the control thread arrangement is illustrated using the following example. Stepper A produces wafers with a translational error of 0.05 microns, Stepper B has an error of −0.05 microns, and Stepper C has 0.1 microns of error. If a semiconductor wafer lot was processed on Stepper A, then it was processed on Stepper B at the next layer, the misregistration error between them would be −0.1 microns. If the lot were processed on Stepper B and Stepper C instead, the misregistration would be 0.15 microns. The error is different depending upon which conditions were present when the lot was processed. Below is a table of the possible error outcomes, given the stepper/stepper pair used in processing.

TABLE 1

MISREGISTRATION AS A FUNCTION OF STEPPER/STEPPER PAIR

|  | Stepper A | Stepper B | Stepper C |
| --- | --- | --- | --- |
| Stepper A | 0 | −0.1 | 0.05 |
| Stepper B | 0.1 | 0 | 0.15 |
| Stepper C | −0.05 | −0.15 | 0 |

One of the advantages of the control thread framework is illustrated in this example. There are three possible misregistration values for each of the steppers, depending upon which stepper processed the wafer lot at the last layer. One problem that arises is the controller cannot predict what the misregistration will be for the next semiconductor wafer lot that is processed on the same semiconductor manufacturing tool. Utilizing the control threads, each of the conditions illustrated in Table 1 would have its own controller. Since only one condition would exist for each controller, that controller would be able to predict the misregistration that the next semiconductor wafer lot could encounter and adjust the control input signals accordingly.

The scatterometry tool 230 provides a measure of the control error. Each of the misregistration measurements corresponds to one of the overlay control input signals. The controller 240 may perform preprocessing or data manipulation activities. One such preprocessing activity is outlier rejection. Outlier rejection is a gross error check that is employed to ensure that the measured misregistration is reasonable in light of the historical performance of the semiconductor manufacturing process. This procedure involves comparing each of the misregistration errors to a corresponding predetermined boundary parameter. In one embodiment, even if one of the predetermined boundaries is exceeded, the error data from the entire semiconductor wafer lot may be rejected. To determine the limits of the outlier rejection boundary, thousands of actual semiconductor manufacturing fabrication data points are collected. The standard deviation for each error parameter in this collection of data is then calculated. The boundary threshold is selected as a multiple of the standard deviation (i.e., positive or negative). The selection of the outlier rejection boundary helps ensure that only the points that are significantly outside the normal operating conditions of the process are rejected.

A second preprocessing function the controller 240 may perform is to smooth out or filter the data. Misregistration measurements are subject to a certain amount of randomness. Filtering the misregistration data results in a more accurate assessment of the error in the overlay control input signal settings. In one embodiment, the controller 240 uses an Exponentially-Weighted Moving Average (EWMA) filter to smooth the data, although other filtering procedures may be used. The equation for an EWMA filter is illustrated in Equation 2.

$$\text{New average}=(\text{weight})*(\text{current measurement})+(1-\text{weight})*(\text{previous EWMA average})] \quad (2)$$

The weight is an adjustable parameter that can be used to control the amount of filtering and generally has a value between zero and one. The weight represents the confidence in the accuracy of the current data point. If the measurement is considered to be accurate, the weight should be close to one. If there were a significant amount of fluctuations in the process for previous processing runs, then a number closer to zero would be appropriate. The new average is calculated from the current measurement, the weight, and the last average calculated. The EWMA filtering process may use the previous average, the weight, and the current measurement as described above, or alternatively, only some of the data (i.e., the most recent) may be used to calculate the average.

The manufacturing environment in the semiconductor manufacturing facility presents some unique challenges. The order that the semiconductor wafer lots are processed through tools, such as the stepper 224, may not correspond to the order in which the scatterometry tool 230 measures the misregistration. Such a situation could lead to data points being added to the EWMA average out of sequence. Also, wafers may be analyzed more than once to verify the misregistration measurements. Without data retention, both readings would contribute to the EWMA average, which may be an undesirable characteristic. Furthermore, some of the control threads may have low volume, which may cause the previous average to be outdated such that it may not be able to accurately represent the error in the overlay control input signal settings. For these reasons, the controller 240 may access stored data to calculate the EWMA filtered error. Semiconductor wafer lot data, including the lot number, the time the lot was processed on the stepper 224, and the multiple error estimates, are stored in a data store under the control thread name. When a new set of misregistration data is collected, the stack of data is retrieved from data store and analyzed. The lot number of the current semiconductor wafer lot being processed is compared to those in the stack. If the lot number matches any of the data present there, the misregistration measurements are replaced. Otherwise, the data point is added to the current stack in chronological order, according to the time periods when the lots were processed through the stepper 224. In some embodiments, data points may expire after a predetermined time period (e.g., 48 hours).

As described above, the controller 240 may be implemented using an APC framework. Deployment of the control strategy taught by the present invention using the APC framework could require a number of software components. In addition to components within the APC framework, a computer script may be written for each of the semiconductor manufacturing tools involved in the control system, such as the stepper 224. When a semiconductor manufacturing tool in the control system is started, it generally initiates control script to complete the actions implemented by the controller 240. The control methods described above are generally defined and performed in these control scripts.

The controller 240 may implement a control technique for a variety of control parameters for the stepper 224, including an x-translation parameter, a y-translation parameter, an x-expansion wafer scale parameter, a y-expansion wafer scale parameter, a reticle magnification parameter, a reticle rotation parameter, a wafer rotation parameter, and a wafer non-orthogonality parameter.

The misregistration control model may be developed empirically using commonly known linear or non-linear techniques. The control model may be a relatively simple equation based model, as described above (e.g., linear, exponential, weighted average, etc.), or a more complex model, such as a neural network model, principal component analysis (PCA) model, or a projection to latent structures (PLS) model. The specific implementation of the model may vary depending on the modeling technique selected.

Misregistration models may be generated by the controller 240, or alternatively, they may be generated by a different processing resource (not shown) and stored on the controller 240 after being developed. The misregistration model may be developed using the steppers 224 or using a different tool (not shown) having similar operating characteristics. For purposes of illustration, it is assumed that the misregistration model is generated and updated by the controller 240 or other processing resource based on the actual performance of the stepper 224 as measured by the scatterometry tool 230. The misregistration model may be trained based on historical data collected from numerous processing runs of the stepper 224.

Figure 6:
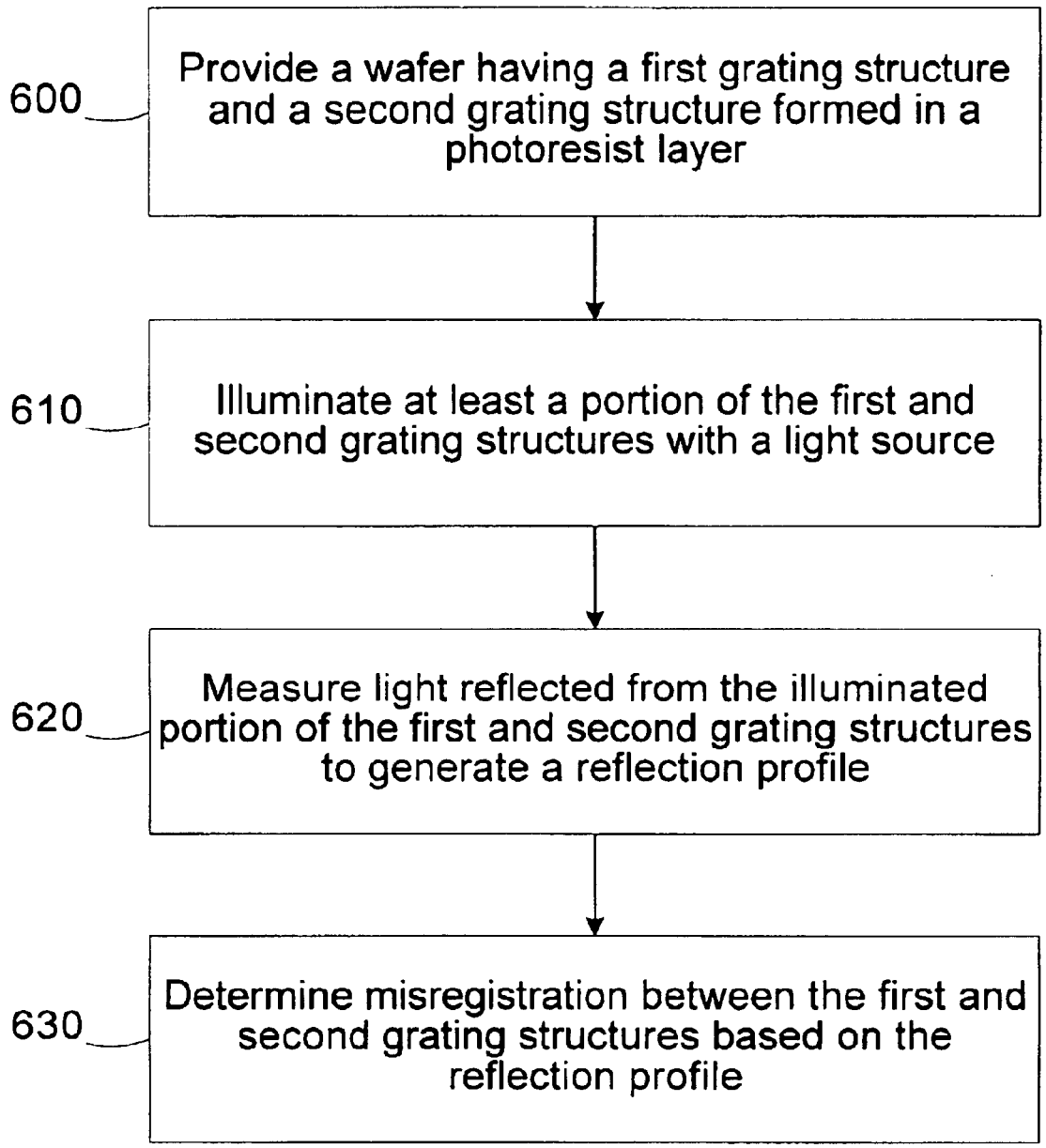
FIG. 6 is a simplified flow diagram of a method for identifying misregistration in accordance with another illustrative embodiment of the present invention.

FIG. 6 is a simplified flow diagram of a method for identifying misregistration in accordance with a another illustrative embodiment of the present invention. In block 600, a wafer having a first grating structure 320, 380 and a second grating structure 340, 390 formed in a photoresist layer is provided. In block 610, at least a portion of the first and second grating structures 320, 340, 380, 390 is illuminated with a light source 232. In block 610, light reflected from the illuminated portion of the first and second grating structures 320, 340, 380, 390 is measured to generate a reflection profile. In block 620, misregistration between the first and second grating structures 320, 340, 380, 390 is determined based on the reflection profile.

Monitoring misregistration based on measurements from the scatterometry tool 230, as described above, has numerous advantages. The stepper 224 may be controlled to reduce the amount of variation encountered. Decreased variation reduces the likelihood that a device may be degraded or must be scrapped. Accordingly, the quality of the devices produced on the processing line 200 and the efficiency of the processing line 200 are both increased.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   providing a wafer having a first grating structure and a second grating structure formed in a photoresist layer;
   illuminating at least a portion of the first and second grating structures with a light source;
   measuring light reflected from the illuminated portion of the first and second grafting structures to generate a reflection profile; and
   determining misregistration between the first and second grating structures based on the reflection profile.

2. The method of 1, wherein providing the wafer further comprises:
   forming the photoresist layer above the wafer;
   patterning the first grating structure using a first photomask; and
   patterning the second grating structure using a second photomask.

3. The method of 2, wherein patterning the first grating structure further comprises patterning the first grating structure using a phase shift photomask and patterning the second grating structure further comprises patterning the second grating structure using a binary photomask.

4. The method of 2, wherein forming the first grating structure further comprises forming a first plurality of lines and forming the second grating structure further comprises forming a second plurality of lines.

5. The method of 4, wherein forming the second plurality of lines further comprises forming the second plurality of lines adjacent the first plurality of lines.

6. The method of 4, wherein forming the second plurality of lines further comprises forming the second plurality of lines interleaved with respect to the first plurality of lines.

7. The method of 1, further comprising determining at least one parameter of an operating recipe for a photolithography stepper based on the determined misregistration.

8. The method of claim 7, wherein determining at least one parameter of the operating recipe of the photolithography stepper comprises determining at least one of an x-translation parameter, a y-translation parameter, an x-expansion wafer scale parameter, a y-expansion wafer scale parameter, a reticle magnification parameter, a reticle rotation parameter, a wafer rotation parameter, and a wafer non-orthogonality parameter.

9. The method of claim 1, wherein determining the misregistration further comprises:
   comparing the generated reflection profile to a library of reference reflection profiles, each reference reflection profile having an associated misregistration metric;
   selecting a reference reflection profile closest to the generated reflection profile; and
   determining the misregistration based on the misregistration metric associated with the selected reference reflection profile.

10. The method of claim 1, wherein determining the misregistration further comprises:
    comparing the generated reflection profile to a target reflection profile; and
    determining the misregistration based on the comparison of the generated reflection profile and the target reflection profile.

11. The method of claim 1, wherein generating the reflection profile comprises generating the reflection profile based on at least one of intensity and phase of the reflected light.

12. The method of claim 1, further comprising identifying a fault condition based on the determined misregistration.

13. The method of claim 2, wherein providing the wafer further comprises developing the photoresist layer to define the first and second grating structures prior to illuminating the first and second grating structures.

14. A method, comprising:
    providing a wafer having a first grating structure and a second grating structure formed in a photoresist layer;
    illuminating at least a portion of the first and second grating structures with a light source;
    measuring light reflected from the illuminated portion of the first and second grating strutters to generate a reflection profile;
    comparing the generated reflection profile to a library of reference reflection profiles, each reference reflection profile having an associated misregistration metric;
    selecting a reference reflection profile closest to the generated reflection profile; and
    determining misregistration between the first and second grating structures based on the misregistration metric associated with the selected reference reflection profile.

15. The method of 14, wherein providing the wafer further comprises:
    forming the photoresist layer above the wafer;
    patterning the first grating structure using a first photomask; and
    patterning the second grating structure using a second photomask.

16. The method of 15, wherein patterning the first grating structure further comprises patterning the first grating structure using a phase shift photomask and patterning the second grating structure further comprises patterning the second grating structure a binary photomask.

17. The method of 15, wherein forming the first grating structure further comprises forming a first plurality of lines and forming the second grating structure further comprises forming a second plurality of lines.

18. The method of 17, wherein forming the second plurality of lines further comprises forming the second plurality of lines adjacent the first plurality of lines.

19. The method of 17, wherein forming the second plurality of lines further comprises forming the second plurality of lines interleaved with respect to the first plurality of lines.

20. The method of 14, further comprising determining at least one parameter of an operating recipe for a photolithography stepper based on the determined misregistration.

21. The method of claim 20, wherein determining at least one parameter of the operating recipe of the photolithography stepper comprises determining at least one of an x-translation parameter, a y-translation parameter, an x-expansion wafer scale parameter, a y-expansion wafer scale parameter, a reticle magnification parameter, a reticle rotation parameter, a wafer rotation parameter, and a wafer non-orthogonality parameter.

22. The method of claim 14, wherein generating the reflection profile comprises generating the reflection profile based on at least one of intensity and phase of the reflected light.

23. The method of clam 14, further comprising identifying a fault condition based on the determined misregistration.

24. The method of claim 15, wherein providing the wafer further comprises developing the photoresist layer to define the first and second grating structures prior to illuminating the first and second grating structures.

25. A method, comprising:
    providing a wafer having a first grating structure and a second grating structure formed in a photoresist layer;
    illuminating at least a portion of the first and second grating structures with a light source;
    measuring light reflected from the illuminated portion of the first and second grating structures to generate a reflection profile;
    comparing the generated reflection profile to a target reflection profile; and
    determining misregistration between the first and second grating structures based on the comparison of the generated reflection profile and the target reflection profile.

26. The method of 25, wherein providing the wafer further comprises:
    forming photoresist layer above the wafer;
    patterning the first grating structure using a first photomask; and
    patterning the second grating structure using a second photomask.

27. The method of 26, wherein patterning the first grating structure further comprises patterning the first grating structure using a phase shift photomask and patterning the second grating structure further comprises patterning the second grating structure using a binary photomask.

28. The method of 26, wherein forming the first grating structure further comprises forming a first plurality of lines and forming the second grating structure further comprises forming a second plurality of lines.

29. The method of 28, wherein forming the second plurality of lines further comprises forming the second plurality of lines adjacent the first plurality of lines.

30. The method of 28, wherein forming the second plurality of lines further comprises forming the second plurality of lines interleaved with respect to the first plurality of lines.

31. The method of 25, comprising determining at least one parameter of an operating recipe for a photolithography stepper based on the determined misregistration.

32. The method of claim 31, wherein determining at least one parameter of the operating recipe of the photolithography stepper comprises determining at least one of an x-translation parameter, a y-translation parameter, an x-expansion wafer scale parameter, a y-expansion wafer scale parameter, a reticle magnification parameter, a reticle rotation parameter, a wafer rotation parameter, and a wafer non-orthogonality parameter.

33. The method of claim 25, wherein generating the reflection profile comprises generating the reflection profile based on at least one of intensity and phase of the reflected light.

34. The method of claim 25, further comprising identifying a fault condition based on the determined misregistration.

35. The method of claim 26, wherein providing the wafer further comprises developing the photoresist layer to define the first and second grating structures prior to illuminating the first and second grating structures.

36. A processing line, comprising:
    a photolithography stepper adapted to process wafers in accordance with an operating recipe;
    a metrology tool adapted to receive a wafer processed in the stepper and having a first grating struck and a second grating structure formed in a photoresist layer, the metrology tool comprising:
        a light source adapted to illuminate at least a portion of the first and second grating structure;
        a detector adapted to measure light reflected from the illuminated portion of the first and second grating structures to generate a reflection profile; and
        a data processing unit adapted to determine misregistration between the first and second grating structure based on the reflection profile; and
    a controller adapted to determine at least one parameter of the operating recipe of the photolithography stepper based on the determined misregistration.

37. The processing line of claim 36, wherein the stepper is configured to pattern the first grating structure using a first photomask and pattern the second grating structure using a second photomask.

38. The processing line of claim 36, wherein the first photomask comprises a phase shift photomask and the second photomask comprises a binary photomask.

39. The processing line of claim 36, wherein the first grating structure comprises a first plurality of lines and the second grating structure comprises a second plurality of lines.

40. The processing line of claim 39, wherein the first plurality of lines is adjacent the second plurality of lines.

41. The processing line of claim 39, wherein the first and second plurality of lines are interleaved.

42. The processing line of claim 36, wherein the controller is further configured to determine at least one of an x-translation parameter, a y-translation parameter, an x-expansion wafer scale parameter, a y-expansion wafer scale parameter, a reticle magnification parameter, a reticle rotation parameter, a wafer rotation parameter, and a wafer non-orthogonality parameter in the operating recipe.

43. The processing line of claim 36, wherein the data processing unit is further adapted to compare the generated reflection profile to a library of reference reflection profiles, each reference reflection profile having an associated misregistration metric, select a reference reflection profile closest to the generated reflection profile, and determine the misregistration based on the misregistration metric associated with the selected reference reflection profile.

44. The processing line of claim 36, wherein the data processing unit is further adapted to compare the generated reflection profile to a target reflection profile and determine the misregistration based on the comparison of the generated reflection profile and the target reflection profile.

45. The processing line of claim 36, wherein the detector is further adapted to generate the reflection profile based on at least one of intensity and phase of the reflected light.

46. The processing line of claim 36, wherein the metrology tool comprises at least one of a scatterometer, an ellipsometer, and a reflectometer.

47. The processing line of claim 36, wherein the controller is further adapted to identify a fault condition based on the determined misregistration.

48. The processing line of claim 36, wherein the photoresist layer comprises an exposed photoresist layer.

49. The processing line of claim 36, wherein the photoresist layer comprises a developed photoresist layer.

50. A metrology tool adapted to receive a wafer having a first grating structure and a second grating structure formed in a photoresist layer, the metrology tool comprising:

a light source adapted to illuminate at least a portion of the first and second grating structures;

a detector adapted to measure light reflected from the illuminated portion of the first and second grating structures to generate a reflection profile; and a data processing unit adapted to determine misregistration between the first and second grating structures based on the reflection profile.

51. The metrology tool of claim 50, wherein the first grating structure comprises a first plurality of lines and the second grating structure comprises a second plurality of lines.

52. The metrology tool of claim 51, wherein the first plurality of lines is adjacent the second plurality of lines.

53. The metrology tool of claim 51, wherein the first and second plurality of lines are interleaved.

54. The metrology tool of claim 50, wherein the data processing unit is further adapted to compare the generated reflection profile to a library of reference reflection profiles, each reference reflection profile having an associated misregistration metric, select a reference reflection profile closest to the generated reflection profile, and date the misregistration based on the misregistration metric associated with the selected reference reflection profile.

55. The metrology tool of claim 50, wherein the data processing unit is further adapted to compare the generated reflection profile to a target reflection profile and determine the misregistration based on the comparison of the generated reflection profile and the target reflection profile.

56. The metrology tool of claim 50, wherein the detector is further adapted to generate the reflection profile based on at least one of intensity and phase of the reflected light.

57. The metrology tool of claim 50, wherein the photoresist layer comprises an exposed photoresist layer.

58. The metrology tool of claim 50, wherein the photoresist layer comprises a developed photoresist layer.

59. An apparatus, comprising:

means for receiving a wafer having a first grating structure and a second grating structure formed in a photoresist layer;

means for illuminating at least a portion of the first and second grating structures with a light source;

means for measuring light reflected from the illuminated portion of the first and second grating structures to generate a reflection profile; and means for determining misregistration between the first and second grating structures based on the reflection profile.

60. The apparatus of claim 59, further comprising:

means for comparing the generated reflection profile to a library of reference reflection profiles, each reference reflection profile having an associated misregistration metric;

means for selecting a reference reflection profile closest to the generated reflection profile; and means for determining the misregistration based on the misregistration metric associated with the selected reference reflection profile.

61. The metrology tool of claim 59, further comprising;

means for comparing the generated reflection profile to a target reflection profile; and means for determining the misregistration based on the comparison of the generated reflection profile and the target reflection profile.

* * * * *